(12) United States Patent
Gehring et al.

(10) Patent No.: US 7,763,505 B2
(45) Date of Patent: Jul. 27, 2010

(54) METHOD FOR REDUCING CRYSTAL DEFECTS IN TRANSISTORS WITH RE-GROWN SHALLOW JUNCTIONS BY APPROPRIATELY SELECTING CRYSTALLINE ORIENTATIONS

(75) Inventors: Andreas Gehring, Dresden (DE); Markus Lenski, Dresden (DE); Jan Hoentschel, Dresden (DE); Thorsten Kammler, Ottendorf-Okrilla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 152 days.

(21) Appl. No.: 11/740,072

(22) Filed: Apr. 25, 2007

(65) Prior Publication Data

US 2008/0081403 A1  Apr. 3, 2008

(30) Foreign Application Priority Data

Sep. 29, 2006  (DE) .................. 10 2006 046 363

(51) Int. Cl.
    *H01L 21/337* (2006.01)
(52) U.S. Cl. .................. 438/187; 438/150; 438/168; 438/198; 257/E21.445
(58) Field of Classification Search .................. 257/66, 257/75, 627, 628, E21.445; 438/486, 501, 438/766, 187, 150, 168, 198
    See application file for complete search history.

(56) References Cited

U.S. PATENT DOCUMENTS

| | | | | |
|---|---|---|---|---|
| 5,145,794 A | * | 9/1992 | Kase et al. | 438/515 |
| 5,571,735 A | * | 11/1996 | Mogami et al. | 438/231 |
| 6,180,476 B1 | * | 1/2001 | Yu | 438/305 |
| 6,680,250 B1 | * | 1/2004 | Paton et al. | 438/660 |
| 2005/0020022 A1 | * | 1/2005 | Grudowski | 438/305 |
| 2005/0170595 A1 | * | 8/2005 | Li et al. | 438/301 |
| 2005/0272213 A1 | * | 12/2005 | Wang et al. | 438/303 |
| 2006/0030094 A1 | * | 2/2006 | Chui et al. | 438/197 |
| 2006/0154429 A1 | * | 7/2006 | de Souza et al. | 438/305 |
| 2007/0010073 A1 | * | 1/2007 | Chen et al. | 438/486 |

FOREIGN PATENT DOCUMENTS

WO  2006/007081  1/2006

OTHER PUBLICATIONS

Giles et al. ("Calculation of Channeling Effects during Ion Implantation using the Boltzmann Transport Equation", IEEE Transaction of Electron Devices, vol. ED-32, No. 10, Oct. 1985).*

(Continued)

*Primary Examiner*—Charles D Garber
*Assistant Examiner*—Yasser A Abdelaziez
(74) *Attorney, Agent, or Firm*—Williams, Morgan & Amerson, P.C.

(57) ABSTRACT

By appropriately adapting the length direction and width directions of transistor devices with respect to the crystallographic orientation of the semiconductor material such that identical vertical and horizontal growth planes upon re-crystallizing amorphized portions are obtained, the number of corresponding stacking faults may be significantly reduced. Hence, transistor elements with extremely shallow PN junctions may be formed on the basis of pre-amorphization implantation processes while substantially avoiding any undue side effects typically obtained in conventional techniques due to stacking faults.

16 Claims, 8 Drawing Sheets

OTHER PUBLICATIONS

Horiuchi et al., "Three-dimensional solid-phase-epitaxial regrowth from drom As+-implanted Si", J. applied Physics, 65(15), pp. 2238-2242, Mar. 1989.*

Sigmon, "Recrystallization of ion implanted amorphous and heavily damaged semiconductors", IEEE Transaction on Nuclear Science, NS-28(2), pp. 1767-1770, Apr. 1981.*

Csepregi et al., "Disorder produced by high-dose implantation in Si", Applied Physics Letters, 29(10), pp. 645-648, Nov. 1976.*

Yamamoto et al., "Orientation dependence of lateral solid-phase-epitaxial growth in amorphous Si films", J. J. of Applied Physics, 25(5), pp. 667-672, May 1986.*

Csepregi et al., "Reordering of amorphous layers of Si implanted with P, As and B ions", J. of Applied Physics, 48(10), pp. 4234-4240, Oct. 1977.*

Letter and official communication dated Aug. 24, 2007 for serial No. 10 2006 046 363.3.

* cited by examiner

METHOD FOR REDUCING CRYSTAL DEFECTS IN TRANSISTORS WITH RE-GROWN SHALLOW JUNCTIONS BY APPROPRIATELY SELECTING CRYSTALLINE ORIENTATIONS

BACKGROUND OF THE INVENTION

1. Field of the Invention

Generally, the present disclosure relates to the manufacturing of integrated circuits, and, more particularly, to the formation of highly scaled transistors having ultra-shallow PN junctions for enhancing device performance.

2. Description of the Related Art

The fabrication of integrated circuits requires the formation of a large number of circuit elements, such as transistors, on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer, typically a silicon layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, renders the channel length an important design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions in order to provide low sheet and contact resistivity in combination with a desired channel controllability. For example, the vertical position of the PN junctions with respect to the gate insulation layer also represents a critical design criterion in view of leakage current control and gate controllability, since reducing the channel length may usually also require reducing the depth of the drain and source regions with respect to the interface formed by the gate insulation layer and the channel region, thereby requiring sophisticated implantation techniques. When forming extremely shallow drain and source regions, appropriate pre-amorphization implantation processes are typically performed to enhance the performance of the subsequent implantation process for introducing the actual dopants for defining the drain and source regions. Upon re-crystallizing the pre-amorphized portions, however, crystalline defects may be generated.

In still other approaches for enhancing the performance of sophisticated transistor devices, strain may be induced in the channel region of the transistor by re-crystallizing the amorphized portions in the presence of a stress layer formed above the transistor area. Also in this case, undue crystalline defects may be created, as will be described in more detail with reference to FIGS. 1a-1c.

It should be appreciated that any statements regarding the position of layers or other features are to be understood as relative position information, wherein a respective substrate is to be considered as a reference. For example, a "vertical" direction is a direction perpendicular to the substrate under consideration. Similarly, a "horizontal" direction is substantially parallel to the substrate surface. A first feature is located "above" a second feature, when the latter one is positioned closer to the substrate.

FIG. 1a schematically shows a semiconductor device 100 comprising a substrate 101, such as a silicon substrate, which may have formed thereon a buried insulating layer 102, above which is formed a crystalline silicon layer 103. Moreover, the semiconductor device 100 comprises a gate electrode 104 formed above the silicon layer 103 and separated therefrom by a gate insulation layer 105. Moreover, a liner 106, for instance comprised of silicon dioxide, may be conformally formed on the gate electrode 104 and the silicon layer 103. The semiconductor device 100 is exposed to an ion implantation process 108 which may be designed such that a region 112 of the silicon layer 103 located adjacent to the gate electrode 104 is substantially amorphized. Furthermore, a doped region 107 may be formed within the layer 103 and may comprise any appropriate doping species that is required for the specific transistor to be formed in combination with the gate electrode 104. The depth of the region 107 may range from several nanometers to 20 nanometers, depending on the overall configuration of the transistor still to be formed. Generally, the depth of the region 107 may be correlated with the gate length, i.e., the horizontal dimension of the gate electrode 104, and the characteristics of the gate insulation layer 105.

A typical process flow for forming the semiconductor device 100 may comprise the following processes. After forming or providing the substrate 101 having formed thereon the buried insulating layer 102 and the silicon layer 103, appropriate implantation sequences may be performed so as to establish a desired vertical dopant profile within the layer 103, which, for convenience, is not shown in FIG. 1a. Thereafter, any appropriate isolation structures (not shown), such as shallow trench isolations or the like, may be formed. Next, an appropriate dielectric material may be formed by deposition and/or oxidation followed by the deposition of an appropriate gate electrode material, wherein both layers may then be patterned on the basis of sophisticated photolithography and etch techniques. Subsequently, the liner 106 may be formed on the basis of well-established plasma enhanced chemical vapor deposition (PECVD) techniques. Depending on the process requirements and strategy, the liner 106 may act as an offset spacer and a screening layer for the formation of the doped region 107 on the basis of well-established implantation techniques. Furthermore, prior to forming the doped region 107, which may comprise a P-type dopant or an N-type dopant, depending on whether a P-channel transistor or an N-channel transistor is to be formed, an amorphization implantation process 108 may be performed in order to reduce channeling effects during the formation of the regions 107, thereby increasing the accuracy of the vertical position and dimension of respective portions of drain and source regions still to be formed. For this purpose, an appropriate dose and energy for an implant species under consideration may be selected on the basis of well-established recipes, thereby forming the substantially amorphized regions 112. For example, xenon, germanium or other heavy ions are suitable candidates for the amorphization implantation 108. Thereafter, a spacer layer may be formed above the semiconductor device 100, wherein, in some approaches, the corresponding spacer layer may exhibit a specified type of intrinsic stress, such as tensile or compressive stress. After the deposition of the layer or after a subsequent patterning of the spacer layer into respective sidewall spacers on the basis of anisotropic etch techniques, in some approaches, an anneal process may be performed in order to re-crystallize the substantially amorphized regions 112, while, in other approaches, respective "deep" drain and source regions may be formed, followed by a common anneal process.

FIG. 1b schematically shows the semiconductor device 100 after the completion of the above-described process sequence, in which a sidewall spacer 109, which may have a high intrinsic stress, may be formed on sidewalls of the gate electrode 104, while the substantially amorphized regions 112 are substantially re-crystallized and are now indicated as 112A. If the preceding anneal process has been performed on the basis of a highly stressed spacer layer or spacer 109, the re-crystallized regions 112A are re-grown in a strained state, thereby also creating a respective strain 110 in a channel region 115 located below the gate electrode 104. In other cases, the re-grown regions 112A may be formed as substantially non-strained regions. Thereafter, the semiconductor device 100 may be subjected to further manufacturing processes for completing the transistor element.

FIG. 1c schematically shows the semiconductor device 100 with an additional spacer element 111 formed adjacent to the spacer 109 and with respective "deep" drain and source regions 113 formed within the silicon layer 103 and also partially within the region 112A or the region 112, when the respective re-crystallization anneal process has not yet been performed. The device 100 may be formed in accordance with well-established processes, such as further implantation sequences, on the basis of the spacer element 111 in order to obtain the required dopant profile for the drain and source regions 113.

Consequently, an efficient technique for the creation of the shallow region 107 may be obtained. During the operation of the device 100, however, a significant increase in leakage current may be observed, which is believed to be caused by crystalline defects 114, which may also be referred to as "zipper defects," and which may represent a source for reducing the minority charge carrier lifetime, thereby possibly significantly contributing to an increase of leakage current.

Although the approach described with respect to FIGS. 1a-1c provides extremely shallow PN junctions for N-channel transistors and P-channel transistors, here the increased crystalline defects may occupy a significant fraction of the active device region responsible for the overall transistor performance, thereby rendering the conventional technique less attractive for the formation of sophisticated transistor devices.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming sophisticated transistor devices in which portions of drain and source regions may be substantially amorphized in order to enhance subsequent process steps, such as the implantation of dopant species for forming shallow PN junctions as may be required in highly scaled transistor devices. Contrary to conventional transistor designs, the crystallographic orientation of the semiconductor material is taken into consideration in order to significantly enhance the re-crystallization process of the substantially amorphized regions so that the different growth directions during the re-crystallization process may substantially match in order to avoid undue crystalline defects, such as stacking faults and the like. Consequently, by appropriately selecting the crystallographic orientation of the semiconductor base material with respect to the corresponding re-growth directions for re-crystallizing amorphized semiconductor portions, the finally obtained crystalline quality of the respective channel region and the adjacent drain and source regions may be significantly enhanced compared to conventional transistor devices. Thus, extremely shallow PN junctions may be formed on the basis of an efficient pre-amorphization process with a significantly reduced number of crystalline defects with the further option of amorphizing and subsequently re-crystallizing respective transistor portions at any appropriate manufacturing stage substantially without additionally creating any undue crystalline defects.

According to one illustrative embodiment disclosed herein, a method comprises forming a gate electrode above a crystalline semiconductor layer, wherein the gate electrode defines a length direction that is oriented along a predefined crystalline direction defined by a set of Miller indices, wherein the predefined crystalline direction is substantially equivalent to a surface orientation of the crystalline semiconductor layer that is defined by the same set of Miller indices. The method further comprises performing an amorphization implantation process for forming a substantially amorphized region in the initially crystalline semiconductor layer adjacent to the gate electrode. Furthermore, a doped region is formed in the substantially amorphized region and the substantially amorphized region is then re-crystallized to form a PN junction in the semiconductor layer.

According to another illustrative embodiment disclosed herein, a method comprises forming an implantation mask above a crystalline semiconductor layer comprised of a cubic lattice structure, wherein the implantation mask defines a length direction corresponding to a first crystallographic direction that is substantially equivalent to a second crystallographic direction defined by a surface orientation of the crystalline semiconductor layer. Furthermore, the method comprises substantially amorphizing a portion of the semiconductor layer using the implantation mask, and at least one intermediate process is performed on the basis of the substantially amorphized portion. Furthermore, the semiconductor layer is annealed to re-crystallize the substantially amorphized portion.

According to yet another illustrative embodiment disclosed herein, a method comprises selecting a crystalline configuration of a semiconductor layer so as to have a crystallographic surface orientation at its surface that is substantially equivalent to a crystallographic direction of a length direction of a channel region to be formed in the semiconductor layer. The method further comprises forming drain and source regions in the semiconductor layer on the basis of at least one amorphization process to define the channel region between the drain region and the source region. Furthermore, the method comprises annealing the semiconductor layer to re-crystallize substantially amorphized portions in the semiconductor layer.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a cross-sectional view of the transistor device of FIG. 2a;

Figure 1A:
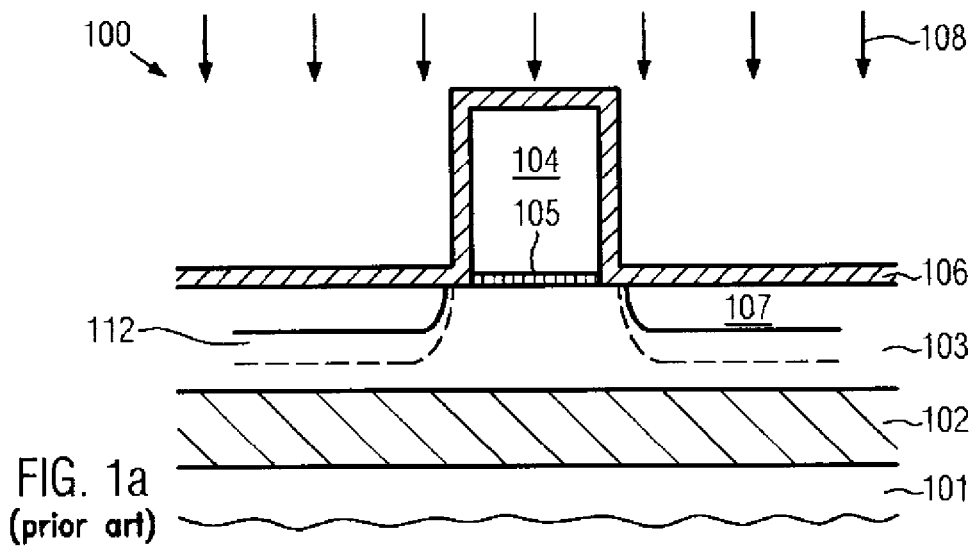
FIGS. 1a-1c schematically illustrate cross-sectional views of a transistor element during various manufacturing stages for forming shallow PN junctions on the basis of a pre-amorphization process according to conventional techniques.
Figure 1B:
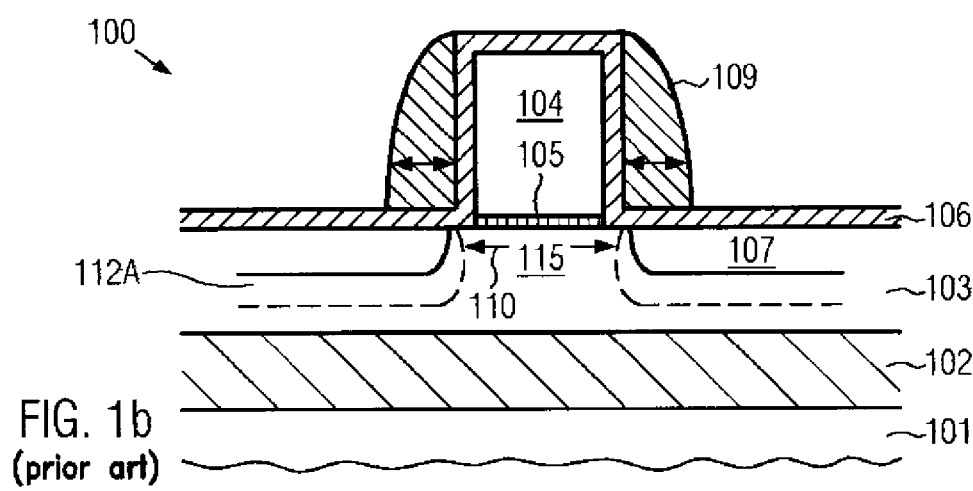

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1C:
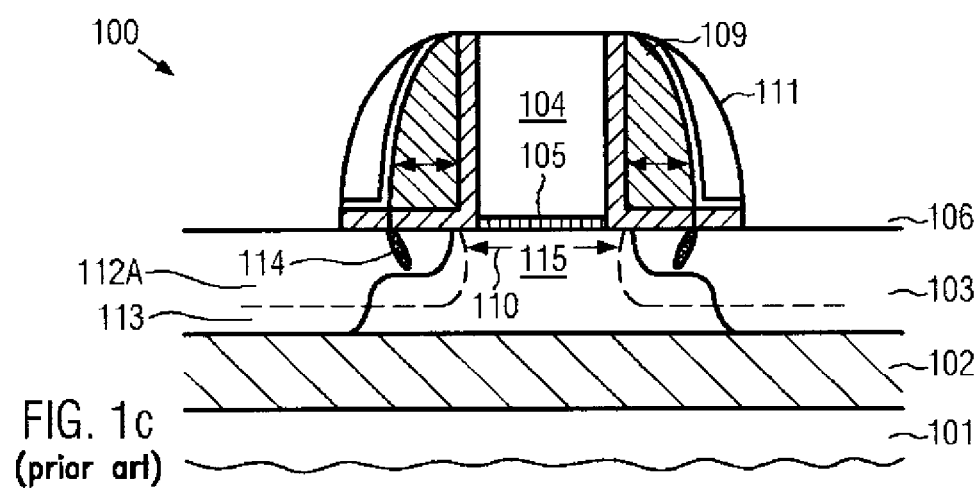

The subject matter disclosed herein relates to manufacturing techniques for forming sophisticated transistor devices, in which amorphized portions near the surface are formed in order to enhance subsequent process steps, such as implantation, re-growth of strained semiconductor material and the like, wherein an induced rate of crystalline defects may increasingly negatively affect the overall transistor performance as transistor dimensions are reduced. For example, as previously explained, in highly scaled transistor devices, a significant degree of leakage currents may be observed, which are believed to be substantially induced by the respective crystalline defects 114 (FIG. 1c) which may therefore render conventional approaches less attractive in which shallow PN junctions may be required. Without intending to restrict the present invention to the following explanation, it is assumed that significant stacking faults may be created in conventional transistor designs due to the respective orientation of the transistor elements with respect to the crystallographic configuration of the silicon-based material, as will be discussed in more detail with reference to FIGS. 1d and 1f.

Figure 1D:
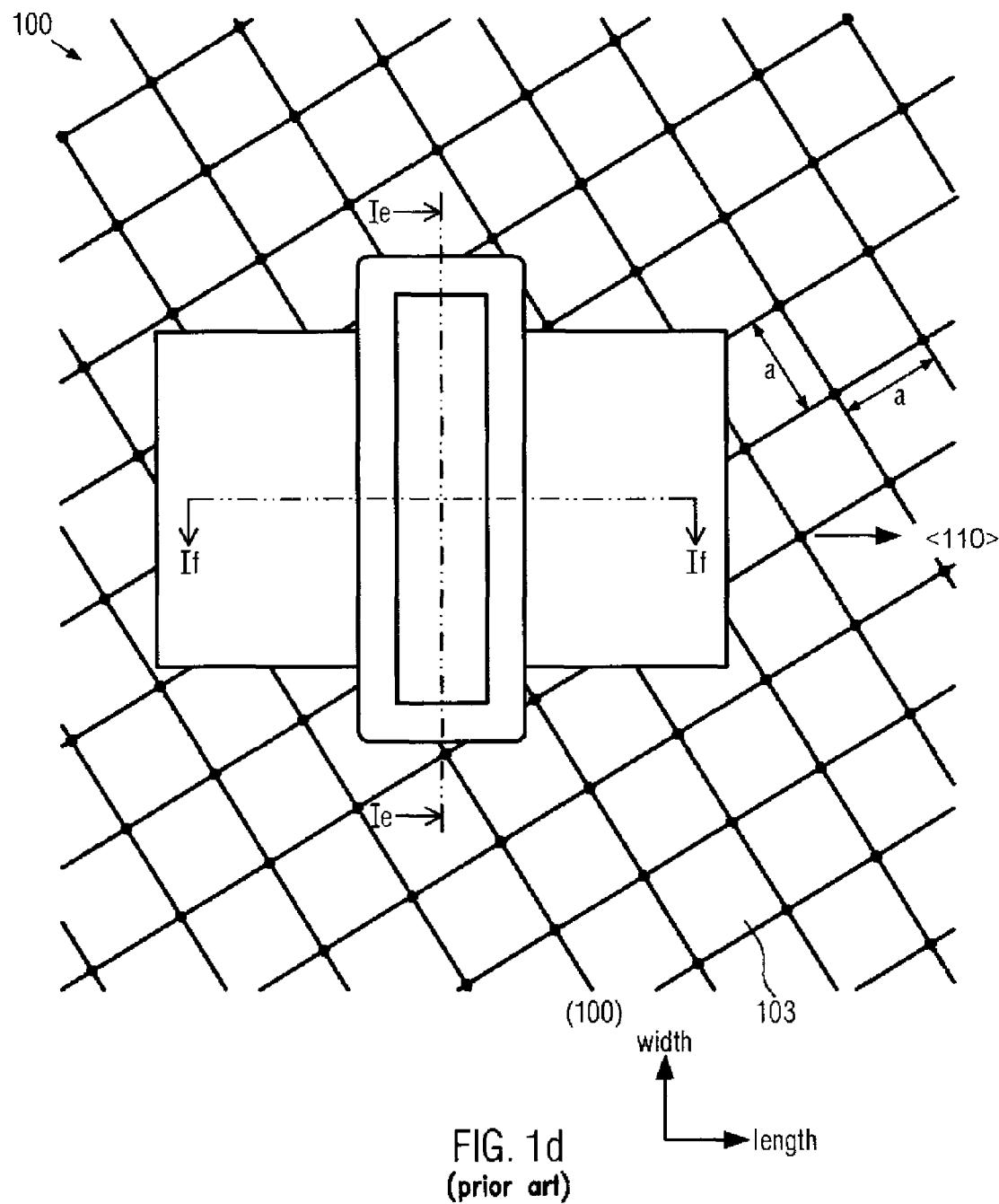
FIG. 1d schematically illustrates a top view of a conventional transistor element formed in accordance with standard crystallographic configurations of a silicon-based layer.

FIG. 1d schematically illustrates a conventional semiconductor device, such as the transistor 100, which may be formed on a silicon layer, such as the layer 103. As is well known in conventional techniques, the semiconductor layer 103 may be provided with a (100) surface orientation, wherein the transistor length direction, i.e., in FIG. 1d, the horizontal direction, is oriented along a <110> direction. In this respect, it should be appreciated that crystallographic orientations are typically expressed by so-called Miller indices, which describe the position and orientation of a crystal plane by giving the coordinates of three non-colinear atoms lying in the plane. This may be conveniently expressed by the Miller indices, which are determined as follows.

First, the intercepts on three basis axes are to be determined in terms of the lattice constant of the semiconductor crystal under consideration. Then, the reciprocals of these numbers are taken and are reduced to the smallest three integers having the same ratio, wherein the respective results are written in parentheses so as to indicate a specific crystalline plane. For convenience, planes equivalent by symmetry are herein denoted also by the same Miller indices. For instance, a (100), a (010) or a (001) are physically equivalent and may commonly be indicated as (100) plane.

Similarly, crystallographic directions may also be expressed on the basis of Miller indices, representing the set of the smallest integers having the same ratios as the components of a respective vector in the desired direction. For example, in crystals having a cubic lattice structure, such as a silicon crystal, a crystallographic direction classified by a certain set of Miller indices is perpendicular to a plane represented by the same set of Miller indices.

Thus, for the standard crystallographic orientation of the silicon layer 103, the respective surface is a (100) surface, while the transistor length direction and the transistor width directions are aligned to the respective <110> directions. Thus, for a crystalline material that has to be grown on the layer 103, a corresponding growth direction, i.e., a direction perpendicular to the drawing plane of FIG. 1d, is a <100> direction.

Figure 1E:
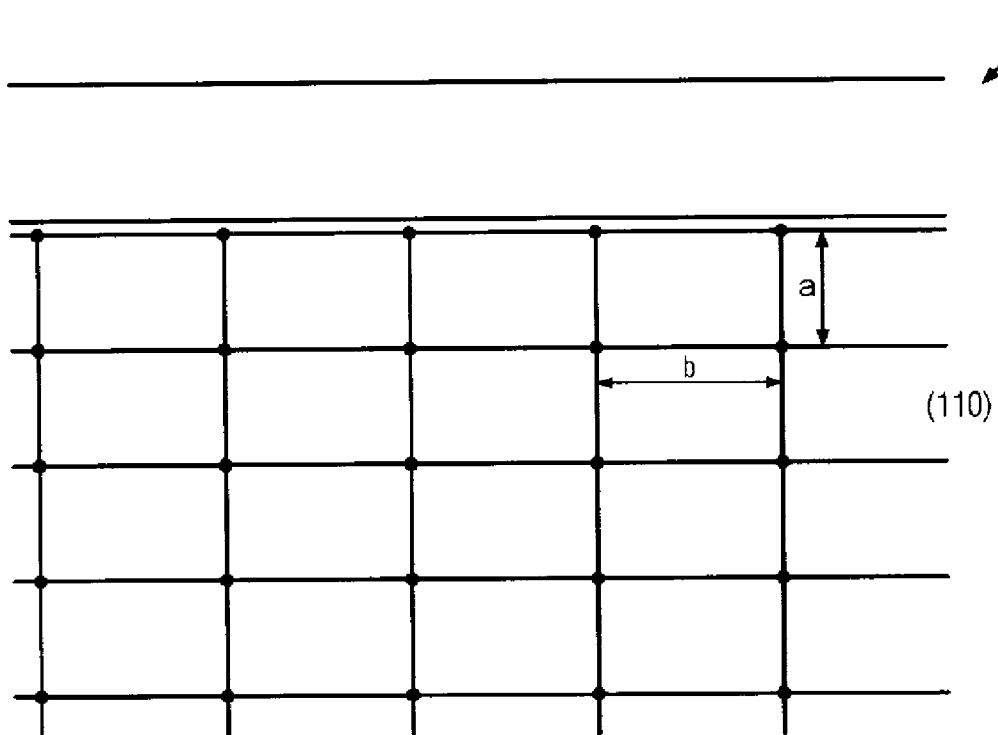
FIGS. 1e-1f schematically illustrate a cross-sectional view along the transistor width direction and the transistor length direction, respectively, wherein different crystallographic surfaces are encountered during the re-crystallization according to conventional techniques.

FIG. 1e schematically illustrates the transistor device 100 in a sectional view as indicated by the line Ie in FIG. 1d. As previously explained, since in a cubic lattice structure, a respective direction is perpendicular to a plane defined by the same Miller indices, the corresponding crystalline plane seen in the sectional view of FIG. 1e represents a (110) plane. Thus, the "a" may represent the basic lattice constant of silicon, and "b" may represent the diagonal dimension ("a" times the square root of 2).

Figure 1F:
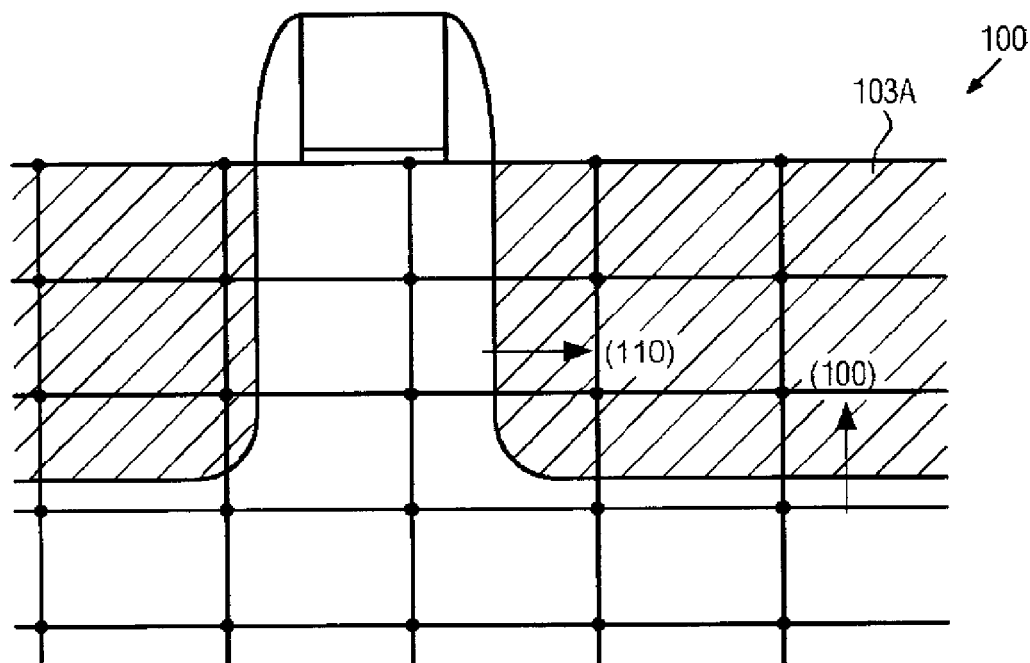

FIG. 1f schematically illustrates a sectional view as indicated by If in FIG. 1d, which also represent a (110) plane, since the transistor length direction is also oriented along the (110) direction. Thus, upon amorphizing a portion of the semiconductor layer 103, indicated as 103A, in order to provide uniform conditions for a subsequent implantation process, the corresponding lattice structure may be substantially completely destroyed. Thereafter, the portion 103A has to be re-grown on the basis of appropriate anneal techniques, wherein respective growth fronts may start from remaining crystalline portions. That is, a growth process may proceed in the horizontal direction, wherein the respective "template" plane may be substantially represented by a (110) plane, as previously explained, while a vertical re-growth direction may be substantially based on a (100) plane, thereby resulting in significant stacking errors at the interface portion of both growth fronts. Finally, respective stacking faults, such as the defect 114 (see FIG. 1c), may be created.

Thus, according to the subject matter disclosed herein, the crystallographic orientation of the semiconductor material may be taken into consideration when placing respective transistor elements thereon in order to obtain a growth behavior producing significantly less stacking faults compared to the conventional configuration.

Figure 2A:
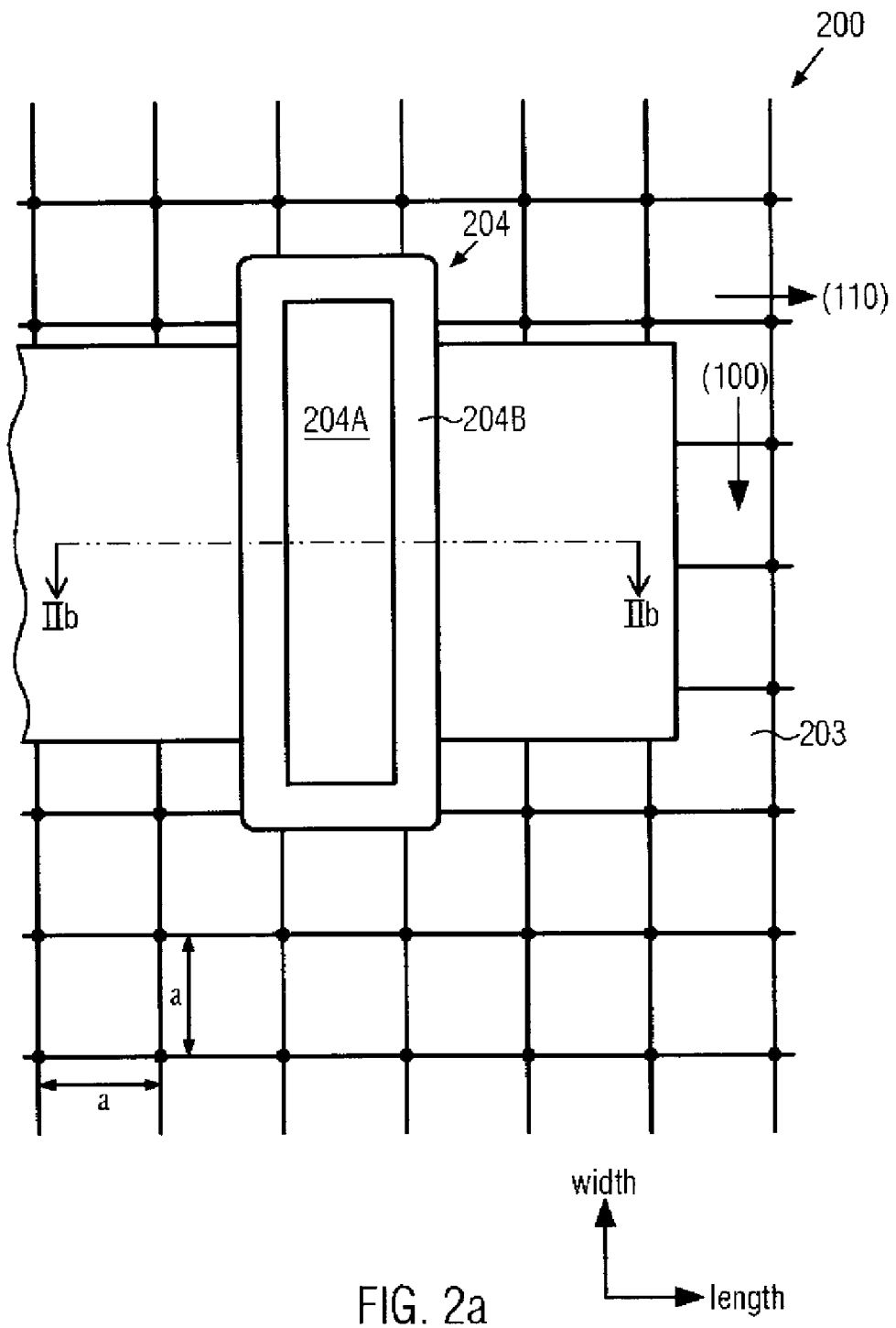
FIG. 2a schematically illustrates a top view of a transistor element formed on a semiconductor material, the crystallographic orientations of which are aligned to the transistor width and length direction in order to reduce stacking faults and other crystalline defects during the re-crystallization according to illustrative embodiments disclosed herein.

FIG. 2a schematically illustrates a top view of a semiconductor device 200, which may comprise a respective implantation mask 204 formed above a crystalline semiconductor layer 203, wherein a length direction of the mask 204, in FIG. 2a the horizontal direction, is aligned to the crystallographic directions of the semiconductor layer 203 in such a way that, upon a re-growth of an amorphized portion thereof in the vertical and horizontal direction, substantially the same, that is, equivalent, crystalline growth directions are obtained. In one illustrative embodiment, the semiconductor device 200 may represent a transistor element, wherein the implantation mask 204 may represent a gate electrode 204A having formed on sidewalls thereof a respective spacer structure 204B with any appropriate dimensions. Furthermore, the semiconductor layer 203 may represent a silicon-based crystalline layer having a (100) surface orientation, wherein the length direction is, contrary to the conventional design, aligned along the <100> direction. That is, with respect to the conventional design as shown in FIG. 1d, the length direction is rotated by 45 degrees, which may, for instance, be accomplished by correspondingly rotating a silicon wafer with respect to the conventional configuration, wherein typically a respective notch may indicate the <110> direction. Thus, by respectively rotating a conventional silicon wafer by 45 degrees around its surface normal in any direction, the configuration as shown in FIG. 2a may be obtained for a conventional silicon wafer.

Figure 2B:
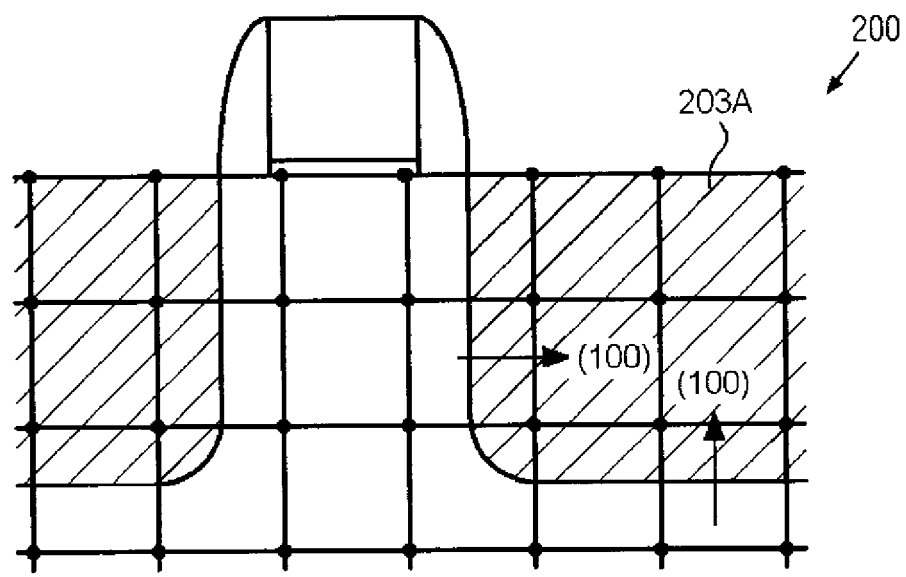

FIG. 2b schematically illustrates a cross-sectional view of the device 200 as shown in FIG. 2a wherein an amorphized portion 203A is schematically shown, which now has horizontal and vertical growth directions, which are specified by the same Miller indices, i.e., the respective template surfaces for the horizontal and the vertical growth process are (100) surfaces thereby substantially avoiding any respective stacking faults, which may be created in the conventional technique.

Consequently, the substantially amorphized portion 203A may be formed at any appropriate manufacturing stage in order to enhance subsequent process steps, such as implantation, re-growth and the like, since significant crystalline defects may be avoided during the subsequent re-crystallization process. Thus, in some illustrative embodiments, the substantially amorphized portion 203A may be formed prior to incorporating an appropriate dopant species so as to position a respective PN junction at a required depth within the semiconductor layer 203. After the respective implantation process, which may be performed on the basis of appropriate implantation energies, for instance for creating shallow dopant profiles, the subsequent re-crystallization process may proceed on the basis of equivalent growth planes, thereby reducing the creation of any crystalline stacking faults.

In other illustrative embodiments, additionally or alternatively to forming shallow dopant profiles, strain-inducing mechanisms may be implemented into the device 200, wherein the enhanced re-growth behavior may significantly reduce crystalline defects, which may be especially created when strained semiconductor material portions are formed in the semiconductor layer 203. For example, in some illustrative embodiments, the substantially amorphous portion 203A may be re-crystallized in the presence of a strained overlying material, as will be described in more detail later on, so that the corresponding re-grown lattice structure may have a slightly modified lattice constant, thereby inducing a respective strain therein. Since the respective re-crystallization process may be performed on the basis of "matching" growth planes, the slight lattice distortion caused by the overlying stressed material may nevertheless result in significantly reduced crystalline defects. Thus, superior crystalline quality as well as an increased overall strain may be achieved, since the number of strain-relaxing crystalline defects may be significantly reduced.

In other illustrative embodiments, the adaptation of crystallographic orientations of the layer 203 with respect to the length and width directions of the gate electrode 204A may also be applied to the formation of other strain-inducing mechanisms, such as the provision of a semiconductor alloy in the silicon-based layer 203, for instance by selective epitaxial growth techniques, implantation and the like. For this purpose, in one illustrative embodiment, respective recesses may be formed in the layer 203 and may be subsequently filled with an appropriate semiconductor alloy, such as silicon/germanium, silicon/carbon and the like, which may now be grown with a reduced amount of stacking faults due to the corresponding adapted crystallographic configuration. In other cases, prior to forming the respective recesses, the amorphized portion 203A may be formed in order to enhance the performance of a respective etch process, or, after forming the respective recesses, the exposed sidewalls thereof may be amorphized, thereby imposing less demanding constraints on the subsequent selective deposition process, wherein the corresponding substantially amorphous semiconductor alloy may be subsequently efficiently re-crystallized. Furthermore, when a substantially crystalline semiconductor alloy may be formed within the semiconductor layer 203, the incorporation of dopant species by ion implantation may be efficiently performed on the basis of respective amorphization implantations preceding the actual implantation process, since thereafter the corresponding semiconductor alloy may be effectively re-crystallized as previously described. Respective anneal processes may be performed on the basis of sophisticated techniques, which may comprise laser-based and flash-based anneal processes, in which respective semiconductor portions are exposed to the respective radiation for extremely short time periods, on the order of milliseconds or even microseconds and less, thereby providing an efficient mechanism for re-crystallizing the amorphous structure while significantly reducing or avoiding any undue diffusion of dopants, components of semiconductor alloys and the like.

Thus, a corresponding amorphization may be performed at any appropriate manufacturing stage, since thereafter the amorphized portions may be re-crystallized with a reduced number of stacking faults, while also undue dopant diffusion may be substantially avoided so that the thermal budget of the respective semiconductor devices may not be negatively affected. Thus, in some illustrative embodiments, a respective atomic species, such as carbon, may be efficiently incorporated into the semiconductor layer 203 by ion implantation, which may be preceded by a pre-amorphization implantation, wherein, after re-crystallization, a respective strained semiconductor material may be obtained, while the creation of stacking faults may be significantly reduced.

Figure 2C:
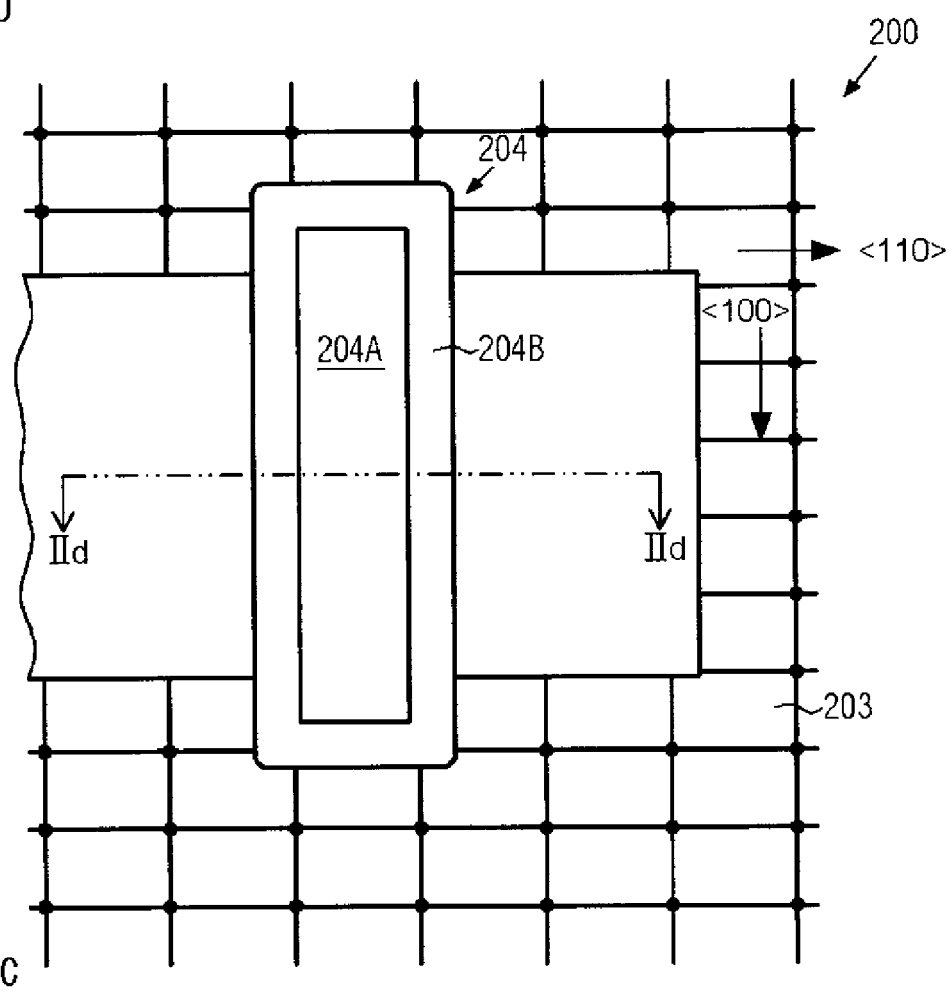
FIGS. 2c-2d schematically illustrate a top view and a cross-sectional view, respectively, of a transistor element formed on a semiconductor material having a different orientation compared to the material in FIGS. 2a-2b, wherein nevertheless a reduced degree of stacking faults may be created during the re-crystallization according to further illustrative embodiments.

FIG. 2*c* schematically illustrates the semiconductor device 200 in accordance with further illustrative embodiments, in which the semiconductor layer 203 may be provided so as to exhibit a (110) surface orientation so that, for a cubic lattice structure, such as silicon, a <100> direction and a <110> direction may be present with an angle offset of 90 degrees, as indicated by the respective arrows in FIG. 2*c*. In the embodiment illustrated in FIG. 2*c*, the gate electrode 204A may be oriented with its length direction along the <110> direction so that, for a silicon-based semiconductor device, substantially the same physical conditions are provided for charge carrier flow behavior and the like as in the standard configuration. However, contrary to the conventional design, the width direction is aligned along the <100> direction.

Figure 2D:
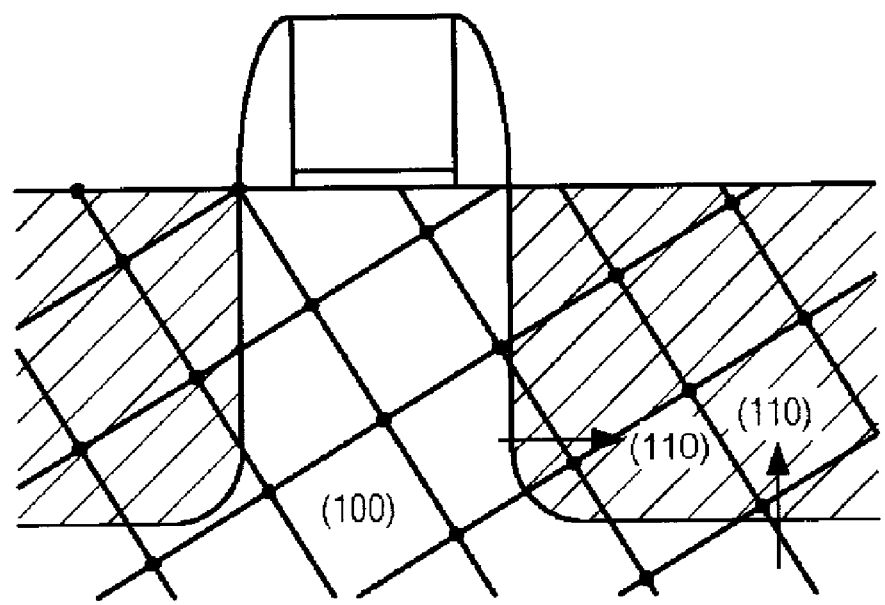

FIG. 2*d* schematically illustrates a cross-sectional view along the length direction, wherein a (100) plane is provided in the drawing plane of FIG. 2*d*, while the respective growth direction for the substantially amorphized portion 203A are based on respective <110> directions. Thus, as explained above, upon re-crystallizing the portion 203A, a significantly reduced number of stacking faults may be created, thereby providing substantially the same advantages as described above. It should be appreciated that the crystalline configuration as described with reference to FIGS. 2*c*-2*d* may provide increased flexibility in designing appropriate semiconductor devices, since two main crystallographic orientations are provided under 90 degree angular offset, which may allow efficient circuit designs, i.e., different orientations of the respective transistor elements, while nevertheless providing high spatial efficiency of the respective design. For example, if transistor elements of reduced crystalline defects may be required, a corresponding orientation of these transistors may be selected, as is shown in FIGS. 2*c*-2*d*. If, in other transistor elements, an increased degree of leakage current may be required, for instance for reducing floating body effects and the like, respective transistor elements may be formed with a 90 degree offset so that the corresponding length direction may be oriented along the <100> direction, thereby creating a respective degree of stacking faults, which may be advantageous in discharging accumulated minority charge carriers.

It should be appreciated that the corresponding crystallographic configurations of the semiconductor layer 203 as shown in FIGS. 2*a*-2*d* are illustrative examples, which may be highly advantageous in combination with standard process techniques, since only minor changes in the corresponding processes may have to be implemented, thereby providing a high degree of compatibility with conventional techniques. For instance, for the embodiment shown in FIGS. 2*a*-2*b*, conventional silicon wafers may be used with the respective rotational offset as described above, wherein, in some process techniques, for instance for tilted implantation processes, a respective modification of implantation parameters may be contemplated so as to take into account a slightly different channeling behavior of respective ion species when penetrating the respective silicon surface under a specified tilt angle. Similarly, respective adaptations may also be employed with respect to the embodiments described with reference to FIGS. 2*c*-2*d*, wherein corresponding modifications of respective implantation parameters may be readily established on the basis of simulation, test runs and the like. It should further be appreciated that, in other illustrative embodiments, other crystallographic configurations, that is, surface orientations, may be provided, wherein the corresponding orientation of respective circuit elements, requiring a re-crystallization on the basis of substantially orthogonal template planes, may be appropriately aligned with respect to the given surface orientation in order to obtain the same type of growth plane for each growth direction. Thus, for cubic lattice structures, the corresponding circuit element, such as a gate electrode or any other implantation mask, may be oriented such that the corresponding orthogonal growth directions are substantially defined by the same Miller indices.

Figure 2E:
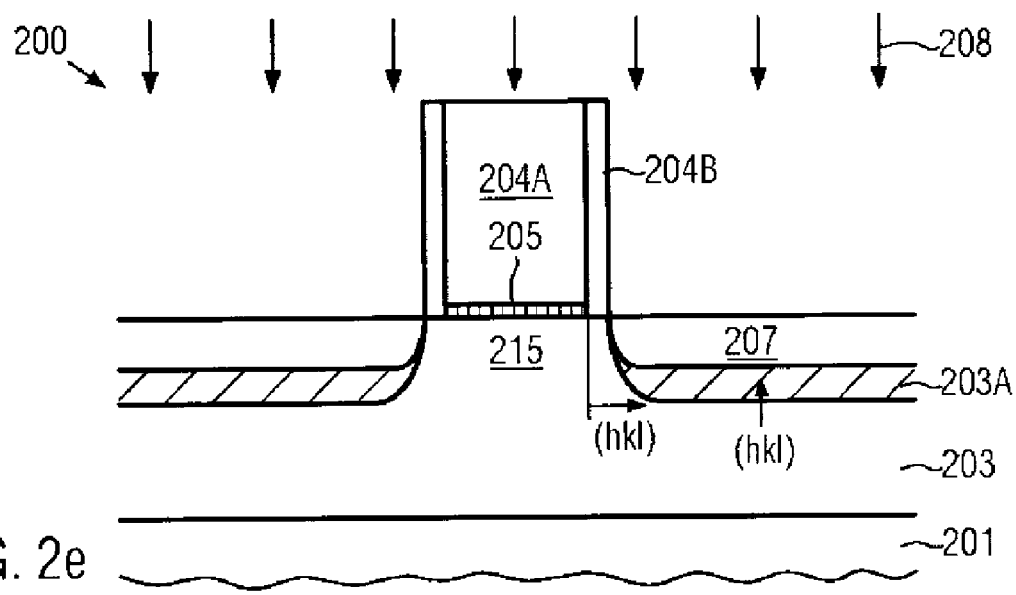
FIGS. 2e-2g schematically illustrate cross-sectional views of a transistor element during various manufacturing stages, wherein the transistor element is oriented such that, during one or more re-crystallization processes, a reduced degree of crystalline defects may be generated according to further illustrative embodiments.

FIG. 2*e* schematically illustrates the semiconductor device 200 in a manufacturing stage in which the substantially amorphized portion 203A may be formed adjacent to the gate electrode 204A having formed on sidewalls thereof an appropriately designed spacer element 204B having a width so as to substantially determine an offset of the amorphized portions 203A with respect to a channel region 215 located below the gate electrode 204A and separated therefrom by a gate insulation layer 205.

The semiconductor device 200 as shown in FIG. 2e may be formed on the basis of the following processes. After providing the semiconductor layer 203, which may be formed on or above any appropriate carrier material 201, such as a semiconductor wafer, a carrier material having formed thereon an insulating layer and the like, thereby providing a silicon-on-insulator (SOI) configuration, the length direction of the gate electrode 204A may be adapted to the crystallographic orientation of the semiconductor layer 203. That is, the length direction of the gate electrode 204A may be selected such that the length direction corresponds to a first crystallographic orientation of the crystalline material of the layer 203, while a corresponding surface orientation of the layer 203 may be defined by a second crystallographic direction, wherein the first and the second crystallographic directions may be substantially equivalent crystallographic directions, that is, these directions may be characterized by the same set of Miller indices. Thus, in some illustrative embodiments, the layer 203 may represent a silicon-based layer, wherein, for surface orientations (100), (110), respectively, a corresponding length direction may be selected as is described above with reference to FIGS. 2a-2b and 2c-2d, respectively. For other surface configurations, other appropriate selections for the length direction may be used. In some illustrative embodiments, a different orientation of the respective length directions of transistor elements may be used for the same semiconductor layer 203, if different characteristics with respect to leakage behavior, strain-inducing mechanisms and the like may be desired. In still other illustrative embodiments, the substrate 201 may have formed thereon respective layer portions of different surface orientation. Also in this case, in one or more of these semiconductor portions of different surface orientation, a corresponding selection of the transistor length direction may be appropriately selected in order to obtain the improved growth behavior upon re-crystallizing the respective substantially amorphized portions 203A.

Thereafter, the gate electrode 204A and the gate insulation layer 205 may be formed on the basis of well-established process techniques, followed by an appropriate manufacturing sequence for forming the sidewall spacers 204B with any required width. Thereafter, an appropriate implantation process may be performed in order to create the portion 203A with an appropriate size and shape. For example, xenon, germanium, silicon or other heavy atomic species may be used for the respective ion implantation process in order to create sufficient crystalline damage at moderate implantation doses. Furthermore, as previously explained, the respective amorphization implantation may be performed with a specified tilt angle when a corresponding "undercut" of the gate electrode 204A may be required. Next, an implantation process 208 may be performed in order to incorporate a desired dopant species for defining respective portions of drain and source regions 207, wherein a respective depth of the regions 207 after implantation may be several nanometers, when very shallow PN junctions are required. Due to the substantially amorphous characteristics of the portion 203A, the penetration depth during the implantation 208 may exhibit a high degree of uniformity due to the absence of crystal-specific influences on the penetrating ion species. Thus, even for extremely low implantation energies, a high degree of process uniformity may be obtained based on the substantially amorphous region 203A.

In some illustrative embodiments, after the implantation 208, a respectively designed anneal process may be performed in order to re-crystallize the portion 203A, thereby also activating the dopants of the region 207. In still other illustrative embodiments, further implantation processes may be performed, for instance by also providing respective additional spacer elements in order to obtain a desired lateral dopant profile for respective drain and source regions, wherein, also in this case, the corresponding implantation processes may exhibit an increased process uniformity due to the substantially amorphous nature of the portion 203A. Thereafter, the device 200 may be annealed for activating dopant species and re-crystallize the portion 203A, wherein the equivalence of the respective vertical and horizontal growth directions may provide a significantly reduced number of crystalline defects.

Figure 2F:
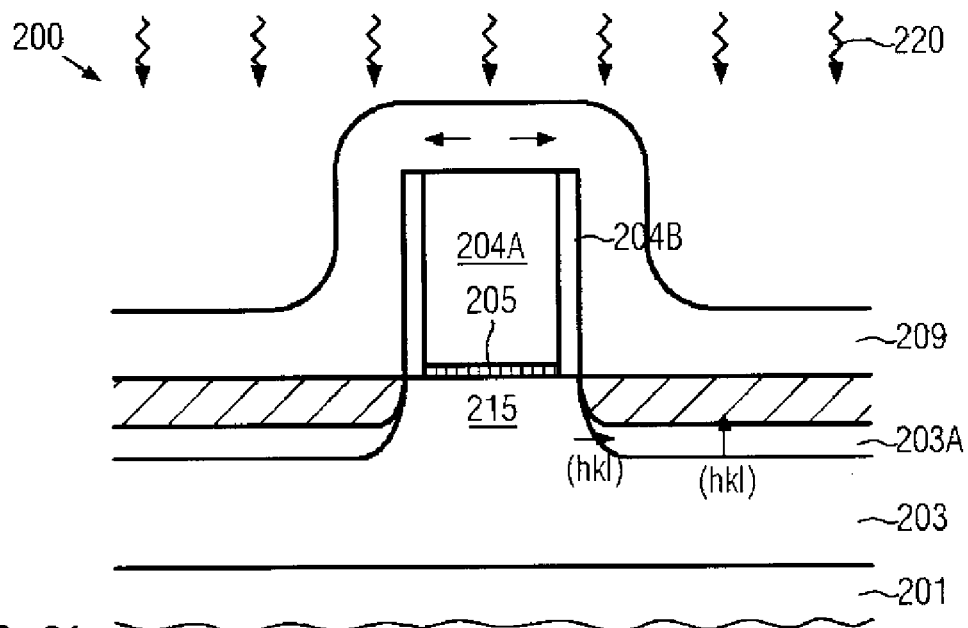

FIG. 2f schematically illustrates the semiconductor device 200 in accordance with further illustrative embodiments. Here, prior to or after performing the implantation process 208, a layer 209 comprised of material having a high intrinsic stress may be formed above the gate electrode 204A and the substantially amorphized portion 203A. For example, silicon nitride may be formed on the basis of PECVD with high intrinsic stress by appropriately controlling respective process parameters, wherein a compressive stress up to 2 GPa and higher and also a tensile stress of 1 GPa and significantly higher may be obtained. It should be appreciated that the layer 209 may comprise an etch stop layer (not shown), if required, in order to facilitate a subsequent complete or partial removal of the stressed layer 209. An anneal process 220 may be performed in order to re-crystallize the portion 203A in the presence of the layer 209, thereby causing the semiconductor material to grow in a strained state, depending on the type of stress in the layer 209. In this case, the high degree of matching of the growth directions in the vertical and horizontal directions may therefore result in a significantly reduced number of crystalline defects, even though the material in the portion 203A is formed in a strained state. Consequently, due to the enhanced re-crystallization behavior, the corresponding strain-inducing mechanism provided by the strained re-crystallization may be significantly enhanced compared to the conventional strategies, as previously described. Furthermore, a high degree of process flexibility may be provided, since the corresponding amorphization and re-crystallization may be performed at any appropriate manufacturing stage. For instance, as shown, the doped region 207 may have been formed prior to the deposition of the stressed layer 209, wherein the doped region 207 may be formed based on a process sequence as previously described with reference to FIG. 2e. In other cases, a corresponding re-crystallization may be performed after forming the stressed layer 209 in order to activate dopant in the region 207 and provide the strained re-crystallization process. In further illustrative embodiments, the doped region 207 may be formed after the anneal process 220 for re-crystallizing the portion 203A on the basis of the layer 209, which may then be removed, wherein nevertheless a certain degree of strain may be "conserved" in the semiconductor layer 203. Thereafter, the further processing may be continued by forming respective drain and source regions, wherein one or more implantation processes may be accompanied by a corresponding amorphization implantation, as previously described. A corresponding "decoupling" of the strain inducing re-crystallization process and the formation of respective drain and source regions may provide increased flexibility in individually adjusting implantation parameters for the respective amorphization processes.

Figure 2G:
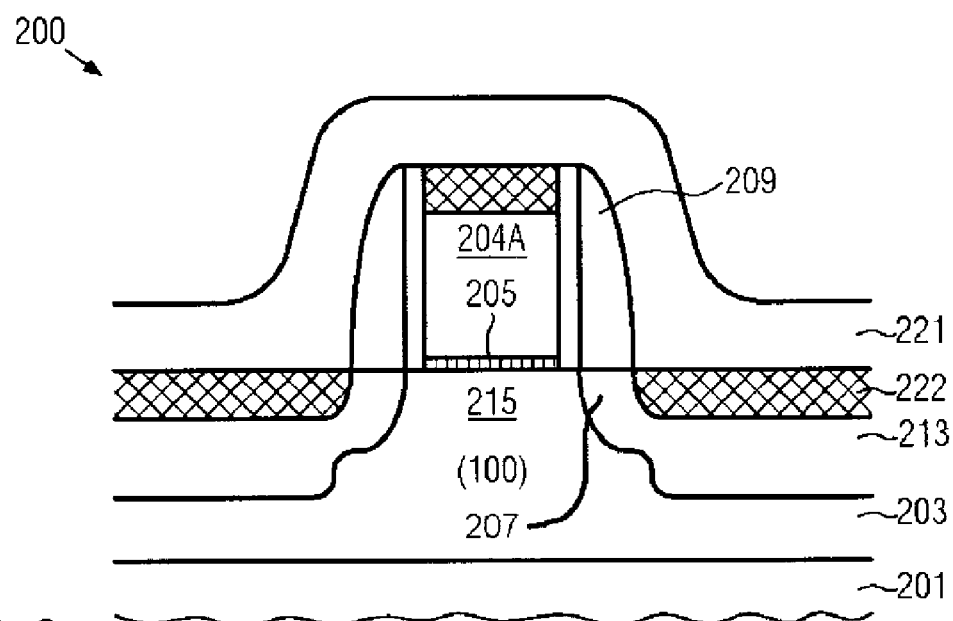

FIG. 2g schematically illustrates the semiconductor device 200 in a further advanced manufacturing stage. The device 200 may comprise drain and source regions 213, in addition to the shallow doped regions 207, which may be referred to as extension regions, wherein additional respective metal silicide regions 222 may be formed in an upper portion of the drain and source regions 213 and in the gate electrode 204A. Furthermore, respective sidewall spacers 209 may be provided and a dielectric layer 221, such as a contact etch stop layer, which may be used for a subsequent patterning of a dielectric material embedding the transistor 200, may be formed above the device 200. In some illustrative embodiments, the layer 221 may comprise a high intrinsic stress in order to induce a respective strain in the channel region 215.

The transistor 200 as shown in FIG. 2g may be formed on the basis of well-established process techniques, which may include any appropriate strategies for providing a desired type of strain in the channel region 215, if sophisticated transistor elements are considered. For instance, as previously explained, in some illustrative embodiments, a strained semiconductor material may be formed in the drain and source regions 213 by using advanced selective epitaxial growth techniques, implantation processes and the like. In these cases, due to the corresponding orientation of the gate electrode 204A with respect to the vertical and horizontal crystallographic directions as explained above, a significant reduction of crystalline defects, especially in the vicinity of the channel region 215, may be achieved, thereby significantly increasing the overall efficiency of the respective strain-inducing mechanism. For example, in some illustrative embodiments, prior to forming the respective metal silicide regions 222, a portion of the drain and source regions 213 may be amorphized by any appropriate implantation process down to a specified depth, followed by a respective implantation of an atomic species of different covalent radius yet having the same valence compared to silicon in order to create a strained semiconductor alloy in the drain and source regions 213. For example, carbon may be incorporated by ion implantation so as to obtain a moderately high concentration of one to several atomic percent, wherein, upon an anneal process, a corresponding strained semiconductor material is formed with a reduced defect rate due to the appropriately oriented re-crystallization directions. In this case, the corresponding amorphization implantation may be performed on the basis of silicon so as to not unduly increase the amount of non-silicon atoms in the regions 213.

In other cases, a respective strained semiconductor material may be formed by selective epitaxial growth, wherein the corresponding growth process may proceed with reduced crystal defects, compared to conventional strategies. Furthermore, in some illustrative embodiments, a silicon/germanium material may be formed in a corresponding recess as a substantially intrinsic material, thereby enhancing the controllability of the respective growth process, wherein afterwards an appropriate dopant profile may be incorporated on the basis of a preceding pre-amorphization implantation described above. Hence, any crystalline damage in the silicon/germanium material caused by the preceding creation of a respective dopant profile may be efficiently re-crystallized without undue crystalline defects, especially in the vicinity of the channel region 215. Consequently, the adaptation of the length and width direction of the gate electrode 204A with respect to the crystallographic configuration of the semiconductor layer 203 may provide the potential of forming extremely shallow PN junctions on the basis of a well-controllable uniform implantation process, while avoiding or at least significantly reducing the number of stacking faults caused by the subsequent re-crystallization process. In addition, strain-inducing mechanisms may be implemented into the transistor design, wherein the enhanced crystalline growth may significantly increase the respective strain-inducing mechanism due to the reduced number of crystalline defects.

Figure 3:
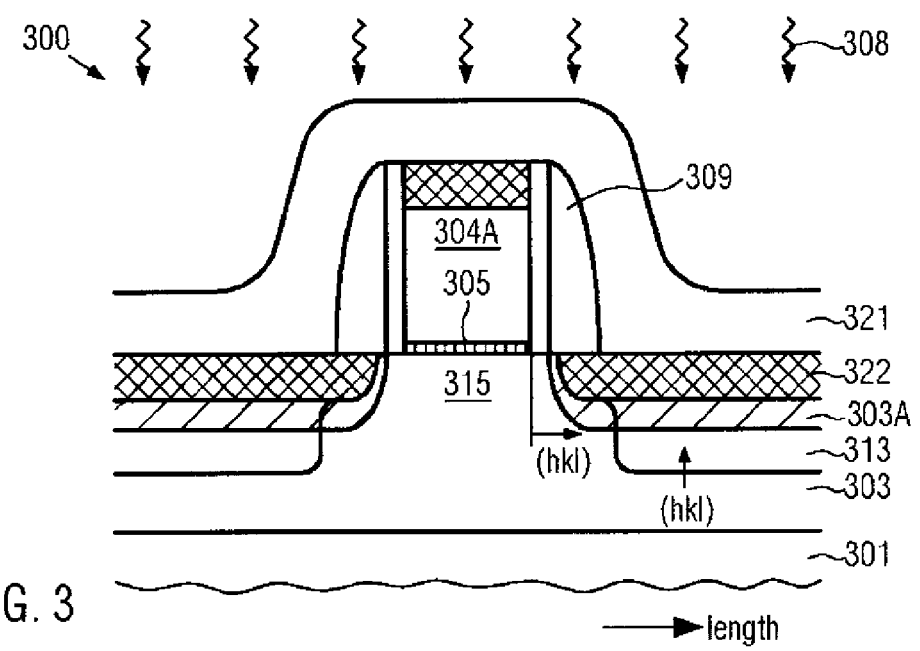
FIG. 3 schematically illustrates a cross-sectional view of a transistor element, which may be formed on the basis of a plurality of amorphization processes and respective re-crystallization processes based on an appropriately selected crystallographic orientation of the semiconductor material according to further illustrative embodiments disclosed herein.

FIG. 3 schematically illustrates a semiconductor device 300 in accordance with further illustrative embodiments of the present invention. In the manufacturing stage shown in FIG. 3, the device 300 may comprise a substrate 301 having formed thereabove a semiconductor layer 303, the crystallographic orientations of which are aligned with respect to length and width directions of a gate electrode 304A formed above a portion of the semiconductor layer 303 and separated therefrom by a gate insulation layer 305. That is, a length direction of the gate electrode 304A may substantially correspond to a crystallographic direction defined by indices (hkl), wherein a corresponding surface orientation of the semiconductor layer 303 may be characterized by the same set of indices. Furthermore, the semiconductor device 300 may comprise respective drain and source regions 313, in an upper portion of which may be formed respective silicide regions 322. Furthermore, a portion of the semiconductor layer 303 adjacent to the gate electrode 304A, which may comprise respective sidewall spacers 309, may be provided as a substantially amorphous semiconductor material. Furthermore, in this manufacturing stage, a dielectric layer 321, which may represent a contact etch stop layer, or any other dielectric material may be formed above the device 300.

A typical process flow for forming the semiconductor device 300 as shown in FIG. 3 may comprise similar processes as previously described with reference to the device 200, wherein, in some illustrative embodiments, the substantially amorphous portions 303A may have been formed at any appropriate manufacturing stage for enhancing respective implantation processes or other manufacturing steps, such as the creation of strained semiconductor material and the like, as is also previously described. In still other illustrative embodiments, the drain and source regions 313 may be formed on the basis of a process sequence as previously described, i.e., by forming a substantially amorphous portion and introducing a respective dopant species on the basis of sophisticated implantation techniques in order to obtain the desired vertical and horizontal dopant profile. Thereafter, the respective substantially amorphized portions may be re-crystallized, wherein the corresponding matching of the horizontal and vertical growth planes may provide the reduced degree of stacking faults, as is previously explained. Thereafter, the amorphized portion 303A may be formed on the basis of a further implantation process so as to provide a substantially amorphous material for the subsequent silicidation process, in which, for instance, nickel silicide, platinum silicide, platinum/nickel silicide and the like may be formed. Due to the substantially amorphous nature of the material in the portion 303A, the corresponding silicidation process may proceed with increased uniformity, thereby providing an enhanced interface between the metal silicide regions 322 and the semiconductor material. Thereafter, an appropriately designed anneal process 308 may be performed so as to re-crystallize the portion 303A, wherein, in some illustrative embodiments, a further thermal stabilizing of the metal silicide regions 322 may also be accomplished. In some illustrative embodiments, the anneal process 308 may be provided in the form of a laser-or flash-based anneal process, wherein respective device portions are irradiated with radiation for extremely short time periods of milliseconds and significantly less, thereby providing a high degree of dopant activation and re-crystallization, while substantially preventing a significant degree of dopant diffusion. Consequently, due to the appropriately selected orientation of the gate electrode 304A with respect to the crystallographic configuration of the semiconductor layer 303, an additional re-crystallization process may not substantially contribute to further crystalline defects, while a significant enhancement of the respective metal silicide regions 322 may be obtained. In some illustrative embodiments, the substantially amorphized portion 303A may be formed at an early manufacturing stage so that the drain and source regions 313 and respective extension regions may also be formed on the basis of the amorphized portion 303A.

In still other illustrative embodiments, the anneal process 308 may be performed after the deposition of the dielectric layer 321, thereby providing increased uniformity of the respective irradiation process. In one illustrative embodiment, the dielectric layer 321 may be provided as a dielectric material having a high intrinsic stress so that the corresponding re-crystallization process may result in a correspondingly strained semiconductor material in the drain and source regions 313, thereby also efficiently transferring the respective strain into the channel region 315. In this way, the stress of the layer 321 may be more efficiently transferred into the channel region 315 compared to conventional strategies, in which a corresponding stressed overlayer is provided above the substantially crystalline drain and source regions. Also, in this case, only a low number of crystalline defects may be generated during the respective re-crystallization process.

It should be appreciated that in addition to the strain-inducing mechanism provided by the layer 321, when formed with high intrinsic stress, other mechanisms may be incorporated into the device 300, as is also described with reference to the device 200.

As a result, the subject matter disclosed herein provides the potential for significantly reducing the number of crystalline defects upon re-crystallizing substantially amorphized portions in a semiconductor layer by taking into consideration the crystallographic configuration of the semiconductor layer with respect to a circuit element formed thereon, adjacent to which a substantially amorphized semiconductor material has to be formed. Thus, by providing substantially physically equivalent growth planes for the vertical and horizontal growth direction upon a re-crystallization process, an enhanced "matching" of the respective growth areas may be achieved, thereby reducing the probability of creating respective stacking faults. Consequently, transistor elements requiring extremely shallow dopant profiles may be formed on the basis of a substantially pre-amorphized semiconductor material, which may then be efficiently re-crystallized. For example, as indicated by respective electron microscopy measurements, for otherwise identical transistor parameters, the degree of typical "zipper" defects may be reduced, while in the conventionally fabricated devices significant stacking faults and thus leakage currents may be observed. Thus, in combination with sophisticated laser and flash anneal processes, crystalline areas may be amorphized and re-grown at any appropriate manufacturing stage, thereby enhancing process and device efficiency substantially without contributing to additional crystalline defects.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode above an initially crystalline semiconductor layer, said gate electrode defining a length direction, said length direction being oriented along a predefined crystalline direction defined by a set of Miller indices, said predefined crystalline direction being substantially equivalent to a surface orientation of said crystalline semiconductor layer that is defined by the same set of Miller indices;
    performing an amorphization implantation process for forming a substantially amorphized region in said initially crystalline semiconductor layer adjacent to said gate electrode;
    forming a strain-inducing material close to a channel region located below said gate electrode;
    forming a doped region in said substantially amorphized region; and
    re-crystallizing said substantially amorphized region to form a PN junction in said semiconductor layer.

2. The method of claim 1, wherein said crystalline semiconductor layer represents a cubic lattice structure and said predefined direction corresponds to a <100> direction.

3. The method of claim 1, wherein said crystalline semiconductor layer represents a cubic lattice structure and said predefined direction corresponds to a <110> direction.

4. The method of claim 1, further comprising performing at least one further amorphization implantation process to substantially amorphize a portion of said semiconductor layer, performing one or more intermediate processes on the basis of said substantially amorphized portion and re-crystallizing said substantially amorphized portion.

5. The method of claim 4, wherein said one or more intermediate processes comprise introducing an atomic species into said substantially amorphized portion, said atomic species having the same valence but a different covalent radius compared to atoms of a base material of said semiconductor layer.

6. The method of claim 4, wherein said one or more intermediate processes comprise forming a metal silicide in said substantially amorphized portion.

7. The method of claim 1, wherein re-crystallizing said substantially amorphized region comprises annealing said semiconductor layer on the basis of at least one of a laser radiation and a flash radiation, wherein a local duration of said annealing is less than approximately 0.1 second.

8. A method, comprising:
    forming an implantation mask above a crystalline semiconductor layer comprising a cubic lattice structure, said implantation mask defining a length direction corresponding to a first crystallographic direction that is substantially equivalent to a second crystallographic direction defined by a surface orientation of said crystalline semiconductor layer;
    substantially amorphizing a portion of said semiconductor layer using said implantation mask;
    performing at least one intermediate process on the basis of said substantially amorphized portion;
    forming a strain-inducing material close to a channel region located below said implantation mask; and annealing said semiconductor layer to re-crystallize said substantially amorphized portion.

9. The method of claim 8, wherein performing said at least one intermediate process comprises implanting a dopant species on the basis of said implantation mask to form a PN junction in said semiconductor layer.

10. The method of claim 8, wherein said first crystallographic direction is a <100> direction.

11. The method of claim 8, wherein said first crystallographic direction is a <110> direction.

12. The method of claim 8, wherein said strain-inducing material is formed after substantially amorphizing said portion.

13. The method of claim 12, wherein said strain-inducing material is formed upon re-crystallizing said substantially amorphized portion.

14. The method of claim 8, wherein said strain-inducing material is formed prior to substantially amorphizing said portion by forming a strained semiconductor material adjacent to said implantation mask.

15. A method, comprising:
selecting a crystalline configuration of a semiconductor layer so as to have a crystallographic surface orientation at a surface of said semiconductor layer that is substantially equivalent to a crystallographic direction of a length direction of a channel region to be formed in said semiconductor layer;
forming drain and source regions in said semiconductor layer on the basis of at least one amorphization process so as to define said channel region between said drain region and said source region;
forming a strain-inducing material close to said channel region; and
annealing said semiconductor layer to re-crystallize substantially amorphized portions in said semiconductor layer.

16. The method of claim 15, wherein a portion of said drain and source regions that is closest to said channel region has a depth of less than approximately 5 nm.

* * * * *